United States Patent
Sharma et al.

(10) Patent No.: US 10,719,644 B2
(45) Date of Patent: Jul. 21, 2020

(54) METHOD AND FRAMEWORK TO DYNAMICALLY SPLIT A TESTBENCH INTO CONCURRENT SIMULATABLE MULTI-PROCESSES AND ATTACHMENT TO PARALLEL PROCESSES OF AN ACCELERATED PLATFORM

(71) Applicant: Synopsys, Inc., Mountain View, CA (US)

(72) Inventors: Amit Sharma, Bengaluru (IN); Rohith MS, Bengaluru (IN); Prashanth Srinivasa, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 30 days.

(21) Appl. No.: 16/024,363

(22) Filed: Jun. 29, 2018

(65) Prior Publication Data
US 2019/0005177 A1    Jan. 3, 2019

(30) Foreign Application Priority Data
Jun. 30, 2017    (IN) .............................. 201741023041

(51) Int. Cl.
*G06F 30/331* (2020.01)
*G06F 30/30* (2020.01)
*G06F 30/398* (2020.01)

(52) U.S. Cl.
CPC ............ *G06F 30/331* (2020.01); *G06F 30/30* (2020.01); *G06F 30/398* (2020.01)

(58) Field of Classification Search
USPC ........................................................ 716/136
See application file for complete search history.

(56) References Cited

U.S. PATENT DOCUMENTS

| | | | |
|---|---|---|---|
| 2003/0069724 A1* | 4/2003 | Schubert | ........ G01R 31/318357 703/16 |
| 2004/0025122 A1* | 2/2004 | Schubert | ............. G06F 17/5022 716/106 |

(Continued)

OTHER PUBLICATIONS

Van Der Schoot et al., "UVM and Emulation: How to Get Your Ultimate Testbench Acceleration Speed-up," DVCON Europe, 16 pages, (2015). [Retrieved from the Internet Nov. 15, 2018: <URL: https://dvcon-europe.org/sites/dvcon-europe.org/files/archive/2015/proceedings/DVCon_Europe_2015_P1_4_Paper.pdf>].

(Continued)

*Primary Examiner* — Mohammed Alam
(74) *Attorney, Agent, or Firm* — Alston & Bird LLP

(57) ABSTRACT

The independent claims of this patent signify a concise description of embodiments. Each component of a testbench configured to test a DUT is associated at compile time with a different hardware transactor. The testbench is partitioned at compile time into a plurality of independent partitioned testbenches, where each independent partitioned testbench comprises at least one component of the testbench. At run time, each of the plurality of partitioned testbenches is simulated in parallel. The simulating of a partitioned testbench includes execution of its at least one component on its at least one associated hardware transactor using the hardware emulation system. This Abstract is not intended to limit the scope of the claims.

22 Claims, 15 Drawing Sheets

(56) References Cited

U.S. PATENT DOCUMENTS

| | | | |
|---|---|---|---|
| 2005/0010880 A1* | 1/2005 | Schubert | G01R 31/31705 716/106 |
| 2005/0144585 A1 | 6/2005 | Daw et al. | |
| 2008/0263486 A1* | 10/2008 | Alexanian | G01R 31/318314 716/106 |
| 2013/0227509 A1 | 8/2013 | Chang et al. | |
| 2015/0040096 A1* | 2/2015 | Chang | G06F 17/5027 716/136 |
| 2019/0005177 A1* | 1/2019 | Sharma | G06F 17/5027 |

OTHER PUBLICATIONS

Aldec, Inc., "Verification IP," Aldec Inc., 2 pages, (2018). [Retrieved from the Internet Nov. 15, 2018: <URL: https://www.aldec.com/en/solutions/hardware_emulation_solutions/verification_ip/print_page>.

* cited by examiner

PRIOR ART

- Testbench execution is single process brings down the overall performance benefit of parallel-process environment

```
module testbench;
  VIP0 vip0;
  VIP1 vip1;
  VIP2 vip2;

string active_processes;
  bit activate_vip0, activate_vip1, activate_vip2;
  initial begin
    if ($value$plusargs("processname=%s", active_processes) begin
      //process the string and extract the activate vip flags
    end if (activate_vip0) begin
      //Enable vip0
    end if (activate_vip1) begin
      //Enable vip1
    end //Synchronization among the processes
    if (activate_vip0)  wait_for_all_processes_complete();
    else this_process_is_done();

end
endmodule
```

```
//Testbench compilation occurs once vcs -sverilog ... testbench.sv vip0.sv vip1.sv vip2.sv //Regardless of compiled mapping of testbench, combinations of mappings can be
changed at runtime.

-No partition
    ./simv +processname=VIP0+VIP1+VIP2 +xtorimportlist+xtor_list_all -3 partitions
    ./simv +processname=VIP0 +xtorimportlist+xtor_list0

./simv +processname=VIP1 +xtorimportlist+xtor_list1

./simv +processname=VIP2 +xtorimportlist+xtor_list2

-2 partitions
    ./simv +processname=VIP0+VIP1 +xtorimportlist+xtor_list0_1

./simv +processname=VIP2 +xtorimportlist+xtor_list2
```

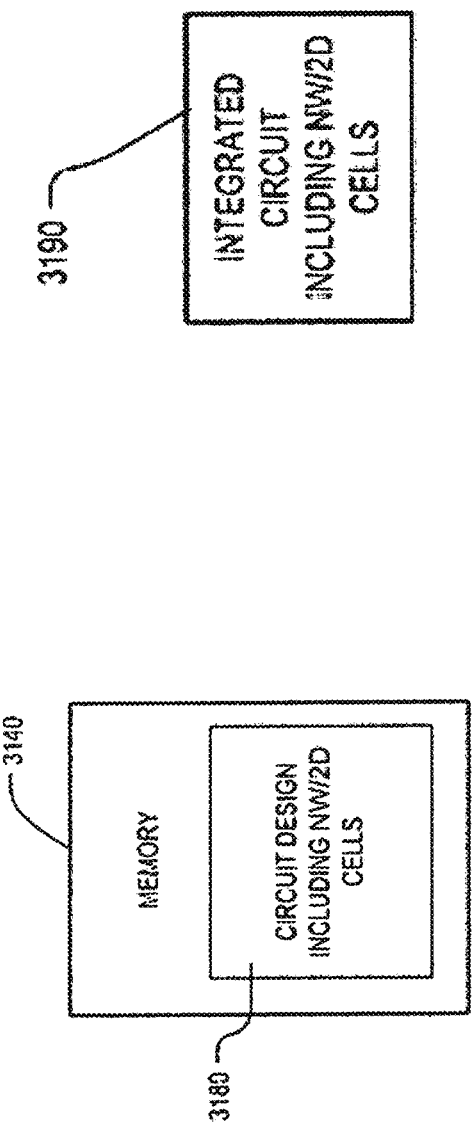

METHOD AND FRAMEWORK TO DYNAMICALLY SPLIT A TESTBENCH INTO CONCURRENT SIMULATABLE MULTI-PROCESSES AND ATTACHMENT TO PARALLEL PROCESSES OF AN ACCELERATED PLATFORM

CROSS REFERENCE TO RELATED APPLICATIONS

The present application claims the benefit of priority to India Patent Application No. IN 201741023041, titled "METHOD AND FRAMEWORK TO DYNAMICALLY SPLIT A TESTBENCH INTO CONCURRENT SIMULATABLE MULTI-PROCESSES AND ATTACHMENT TO PARALLEL PROCESSES OF AN ACCELERATED PLATFORM," filed Jun. 30, 2017, the contents of which are incorporated herein by reference in their entirety.

COPYRIGHT NOTICE

The assignee of this patent document has no objection to the facsimile reproduction by anyone of the patent document itself or of the patent application, as it appears in the files of the United States Patent and Trademark Office, but otherwise reserves all rights whatsoever in any included works of authorship protected by copyright.

SPECIFICATION—DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

BACKGROUND

Simulation acceleration, also known as co-emulation, combines functional simulation with emulation hardware, or prototyping platforms to provide improved runtime performance over a pure simulation platform.

A test bench or testing workbench is an environment used to verify the correctness or soundness of a design or model. In the context of software or firmware or hardware engineering, a test bench is an environment in which the product under development is tested with the aid of software and hardware tools. The software may need to be modified slightly in some cases to work with the test bench but careful coding can ensure that the changes can be undone easily and without introducing bugs.

Behavioral code written in a hardware (HW) description language like Verilog/VHDL or a hardware verification language like System Verilog cannot be synthesized easily and thus cannot be used in emulation or hardware prototyping platforms. Hence, typically most test bench (or "testbench" herein) code which uses behavioral constructs executes on a simulator while the synthesizable code runs much faster in hardware. This is because execution is faster in the hardware and is also concurrent. As a result, the overall performance gains that can be expected through simulation acceleration are directly dependent on the time taken in simulation to execute the non-synthesizable code, as well as the overhead introduced as a result of the communication between the two partitions running on the simulator and in hardware.

Even for a transaction based acceleration where a part of a testbench runs on the hardware, the bottleneck is always on the simulator side. Besides the simulation platforms being evidently slower, the execution in a simulation platform is also single threaded. Whenever there are concurrent requests from the hardware platform (e.g., emulation hardware or FPGAs) to the simulation platform, the request events get pipelined in the simulator event queue and are processed sequentially (and slowly) by the simulation engine. This effectively brings down the potential gain that could have been obtained through simulation acceleration.

SUMMARY

The claims signify a brief description of one or more of the innovations, embodiments, and/or examples found within this disclosure.

Embodiments of the present disclosure are directed to a system for testing an integrated circuit (IC) design under test (DUT). In embodiments, the system comprises a first module configured as a hardware emulation system and a second module configured as a single threaded simulation system comprising a processor and a memory storing instructions. In embodiments, the instructions, when executed by the processor, configure the single threaded simulation system to perform functions described herein.

In embodiments, a module configured as a hardware emulation system comprises a plurality of modules. In embodiments, a module comprises a transactor or a hardware transactor. In embodiments, a module comprises a bus functional model (BFM).

In embodiments, the single threaded simulation system is configured to associate, at compile time, each component of a testbench configured to test the DUT with a different hardware transactor of a plurality of hardware transactors of the hardware emulation system. In embodiments, the testbench comprises a plurality of components. In embodiments, the associating produces an executable file comprising the testbench, the associations between components and hardware transactors, and data representative of the DUT.

In embodiments, the single threaded simulation system is configured to partition, at run time, the testbench into a plurality of independent partitioned testbenches. In embodiments, each independent partitioned testbench comprises at least one component.

In embodiments, the single threaded simulation system is configured to simulate, at run time, each of the plurality of partitioned testbenches in parallel. In embodiments, the simulating of a partitioned testbench includes execution of its at least one component on its at least one associated hardware transactor using the hardware emulation system.

The present disclosure enables code executing on a simulator to be split easily into different partitions and executed in parallel. It also provides the infrastructure for these partitions to work in tandem with the concurrent hardware interfaces in a single co-emulation runtime execution. Thus, the solution of the present disclosure avoids the bottleneck of sequential processing by the simulator, thereby delivering higher simulation acceleration performance. It also enables higher throughput numbers by leveraging the links (e.g., the PCIe bus between the host workstation and the emulation/prototyping hardware) much more efficiently.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

Figure 1A:
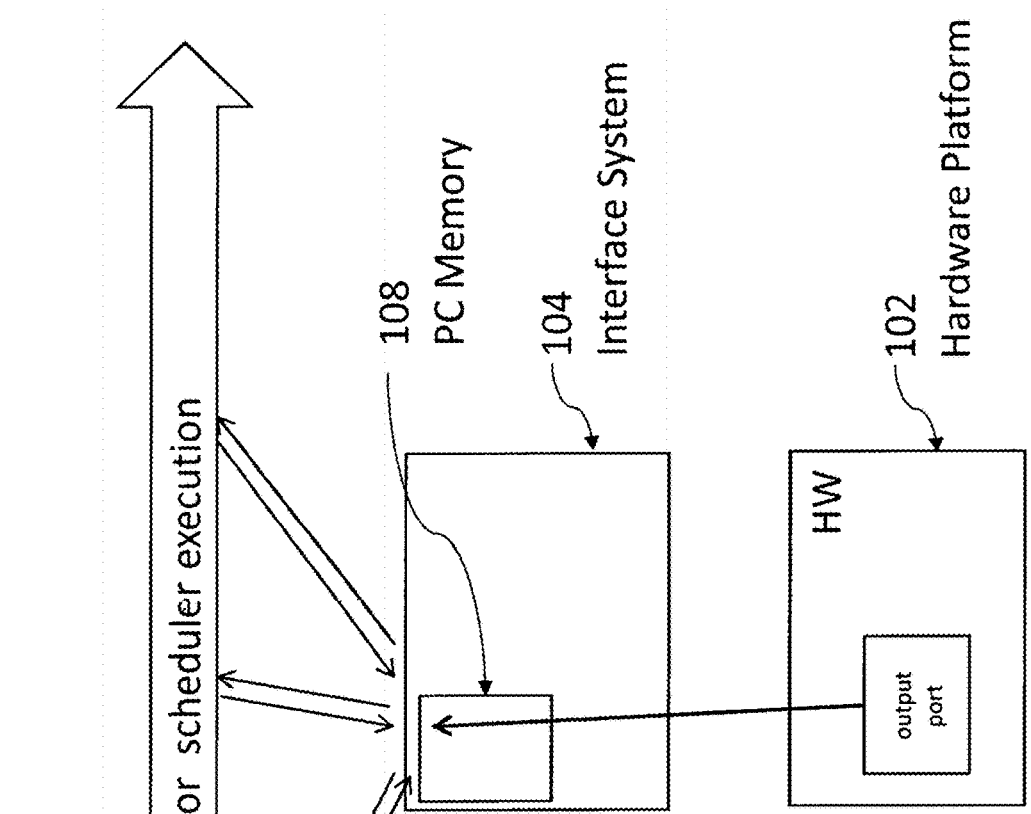
FIG. 1A illustrates a prior art co-emulation environment.
Figure 1B:
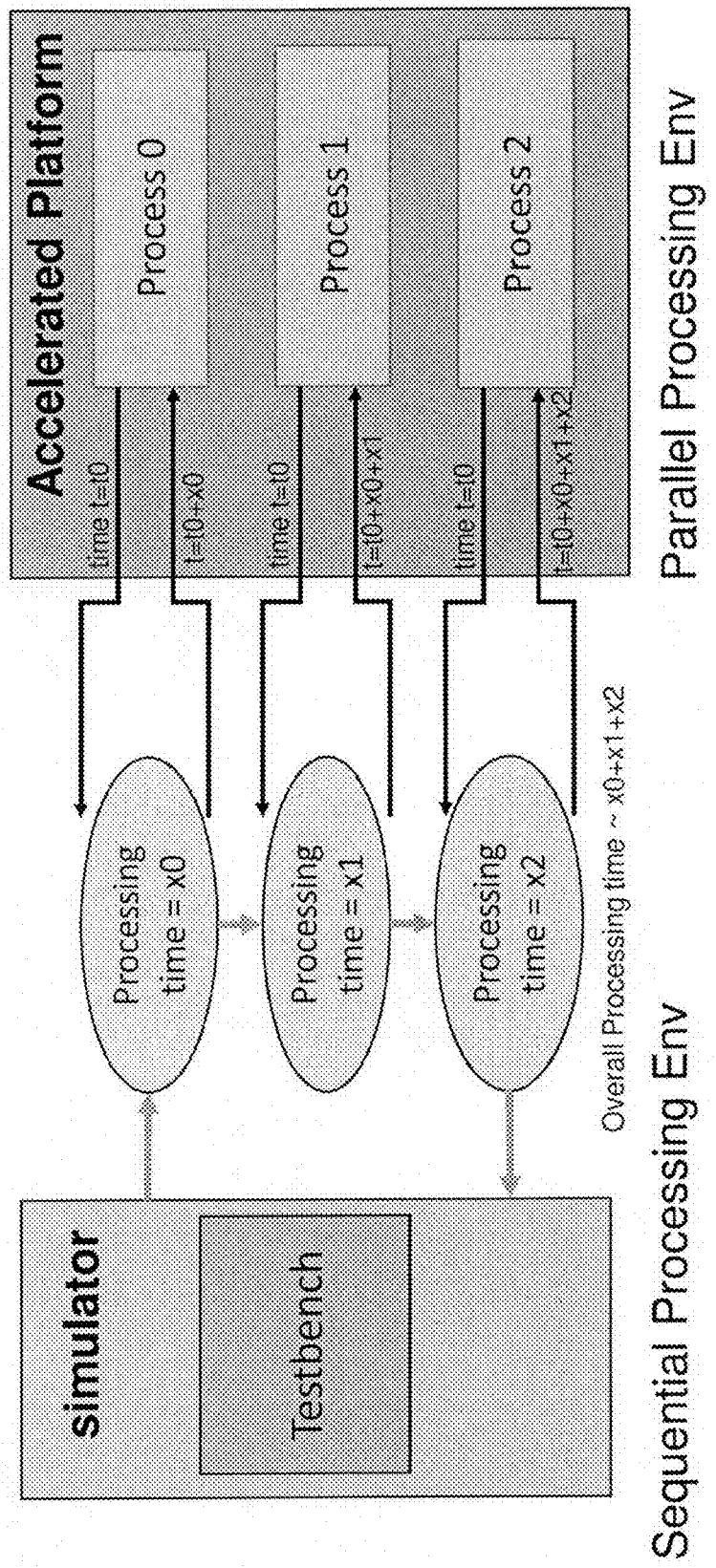
FIG. 1B illustrates a prior art co-emulation environment.
Figure 2:
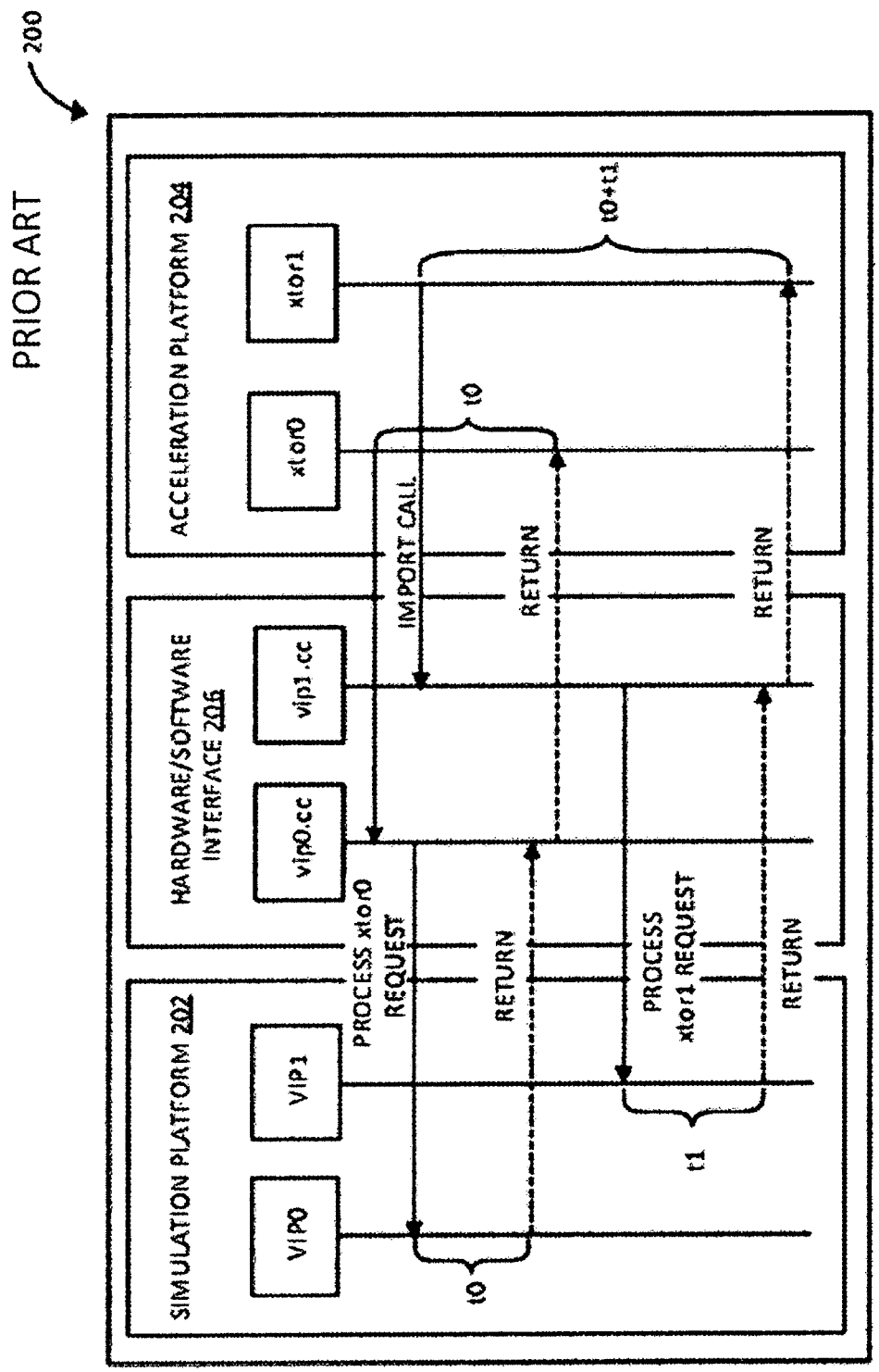

FIG. 2 further illustrates the prior art co-simulation environment depicted in FIG. 1B.

Figure 1C:
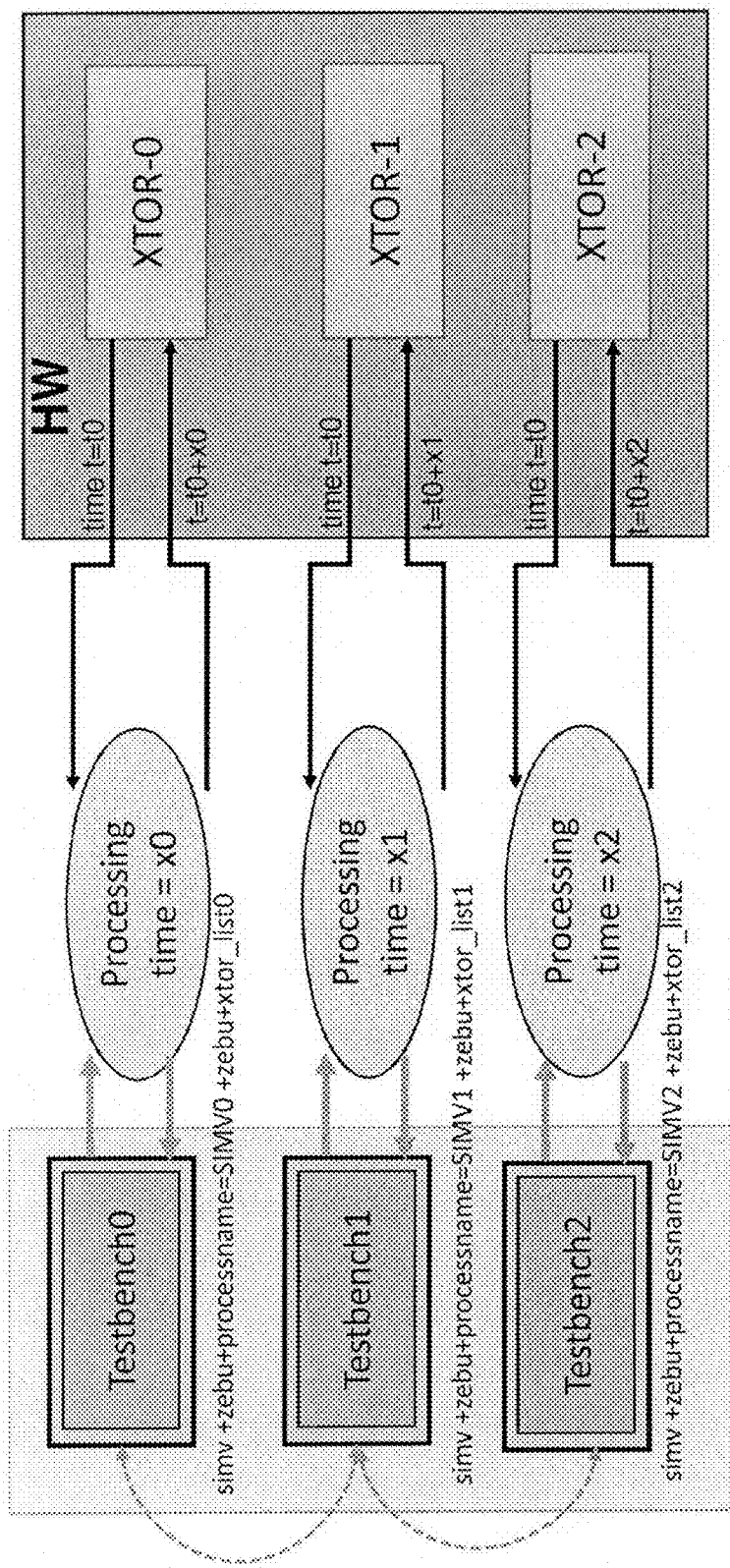
FIG. 1C illustrates an exemplary simulation environment for use with embodiments of the present disclosure.
Figure 3:
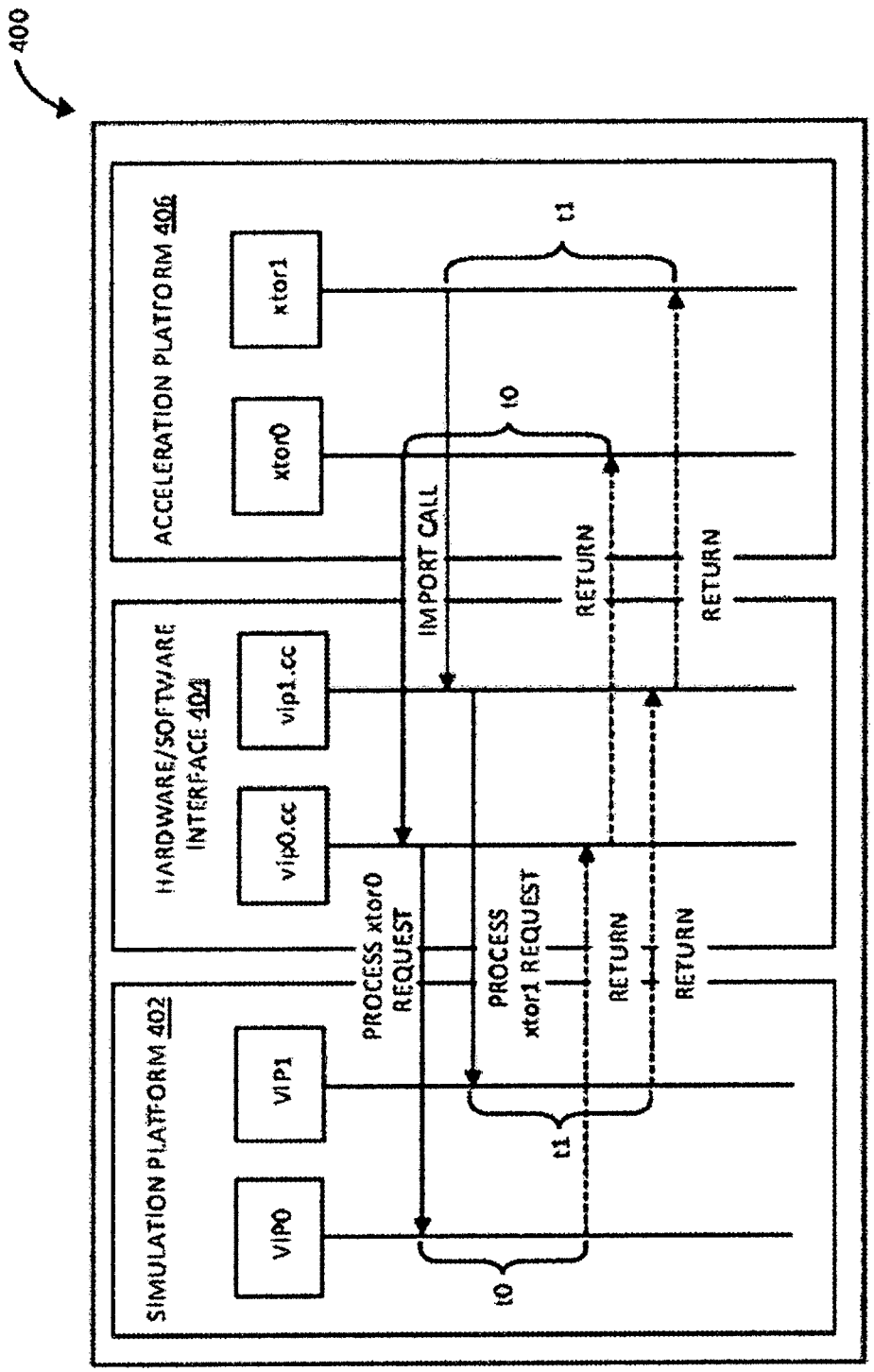

FIG. 3 further illustrates an exemplary simulation environment depicted in FIG. 1C for use with embodiments of the present disclosure.

Figure 4B:
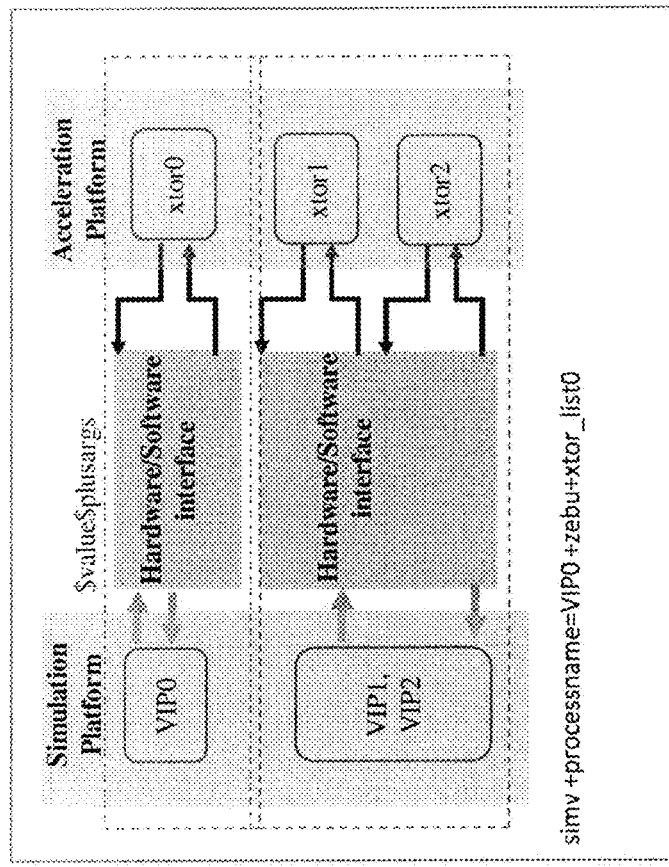
Figure 4A:
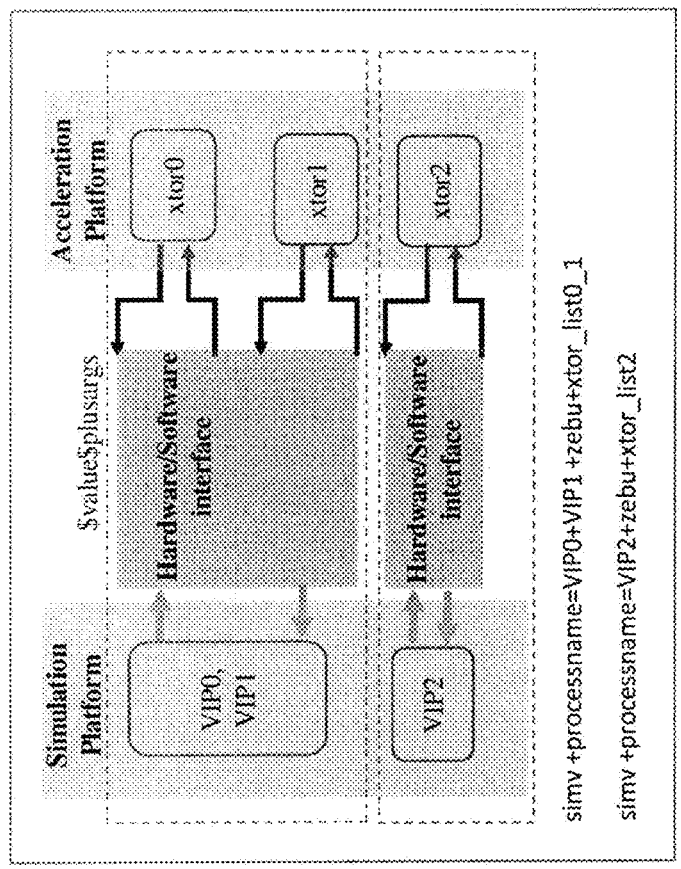

FIG. 4A illustrates an exemplary runtime selection of partitions of a testbench for use with embodiments of the present disclosure.

FIG. 4B illustrates an exemplary runtime partitioning of a testbench for use with embodiments of the present disclosure.

Figure 5A:
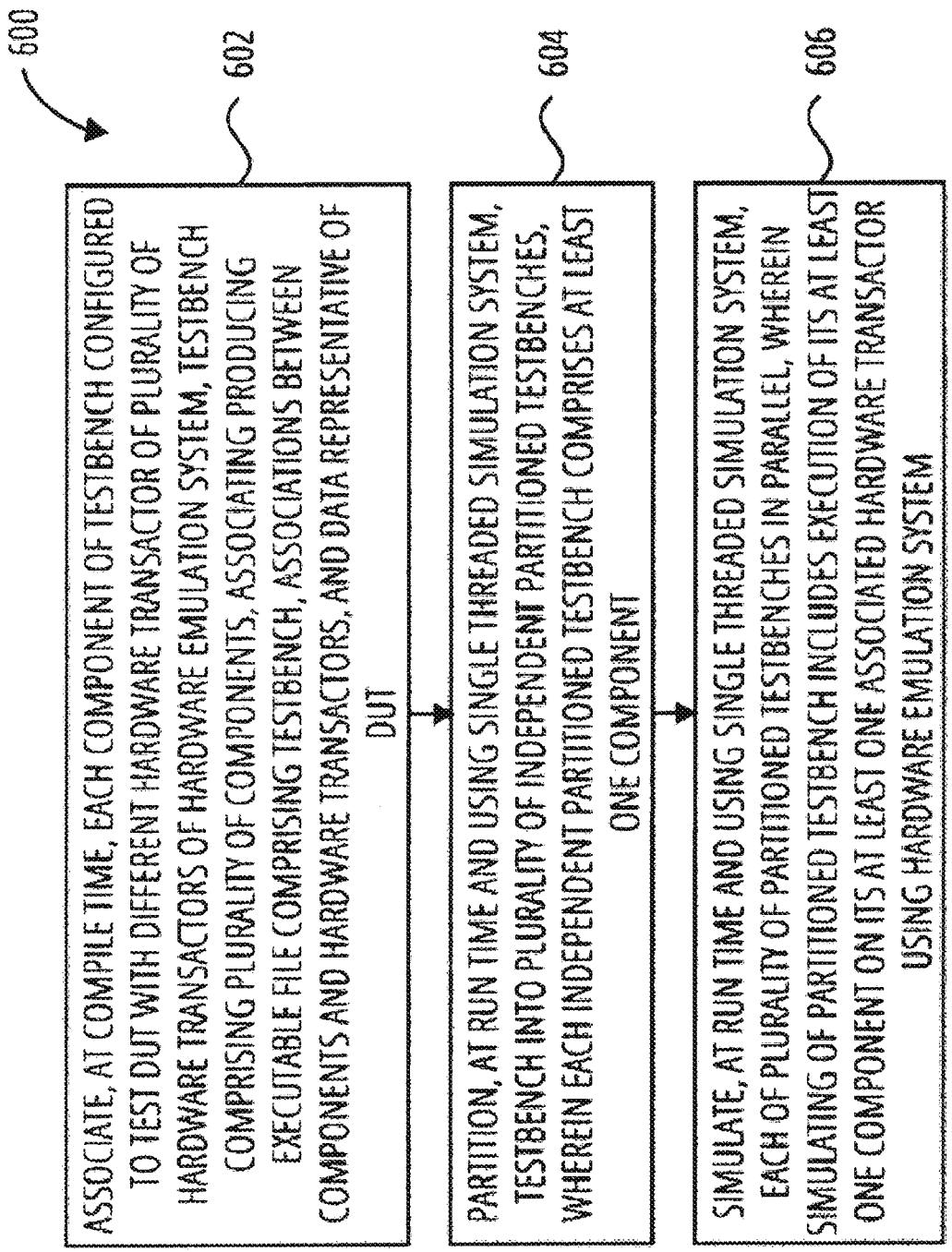

FIG. 5A illustrates a routine for testing an integrated circuit (IC) design under test (DUT) using a hardware emulation system and a single threaded simulation system, in accordance with one embodiment.

Figure 5B:
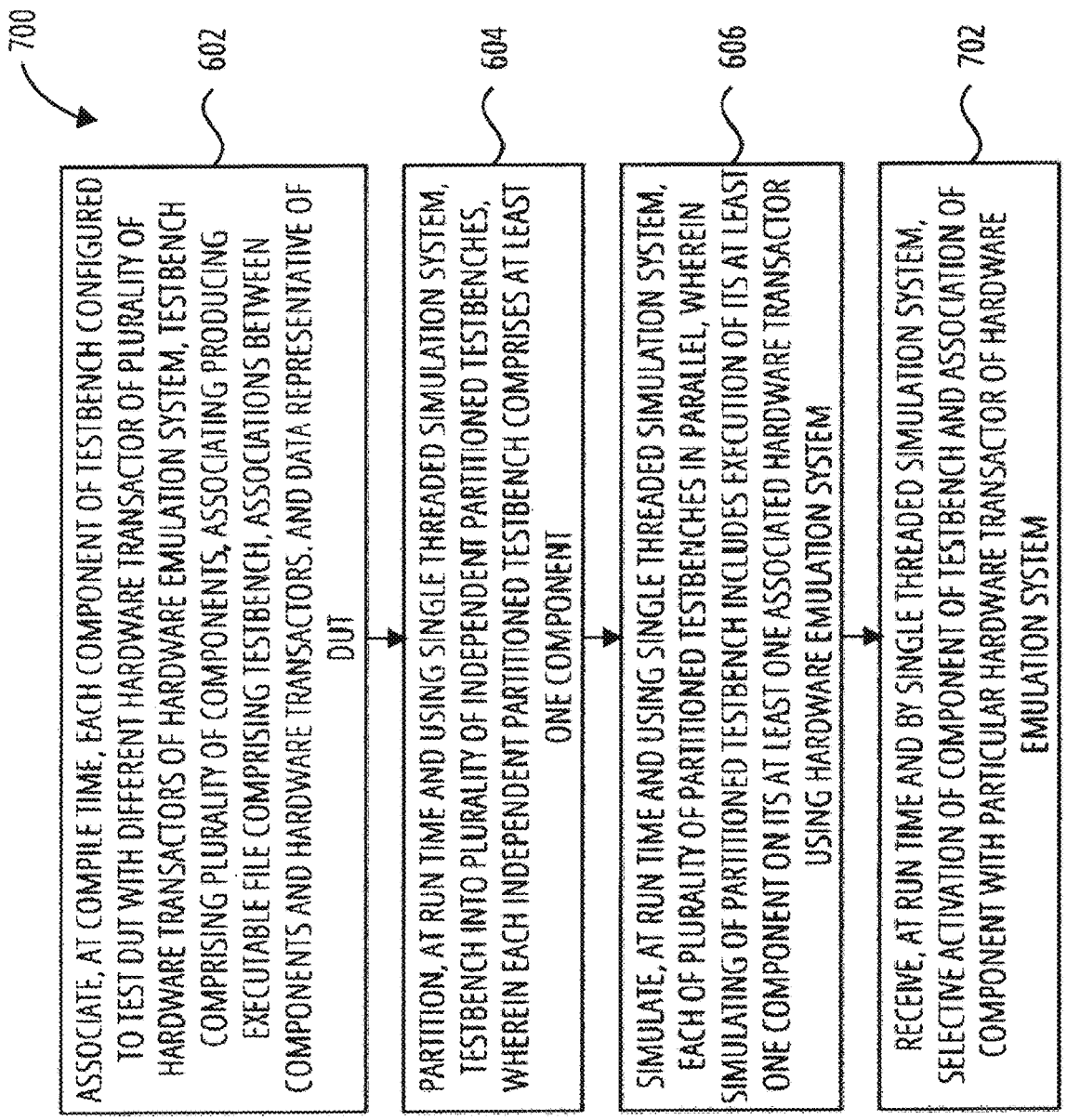

FIG. 5B illustrates a routine for testing an integrated circuit (IC) design under test (DUT) using a hardware emulation system and a single threaded simulation system, in accordance with one embodiment.

Figure 5C:
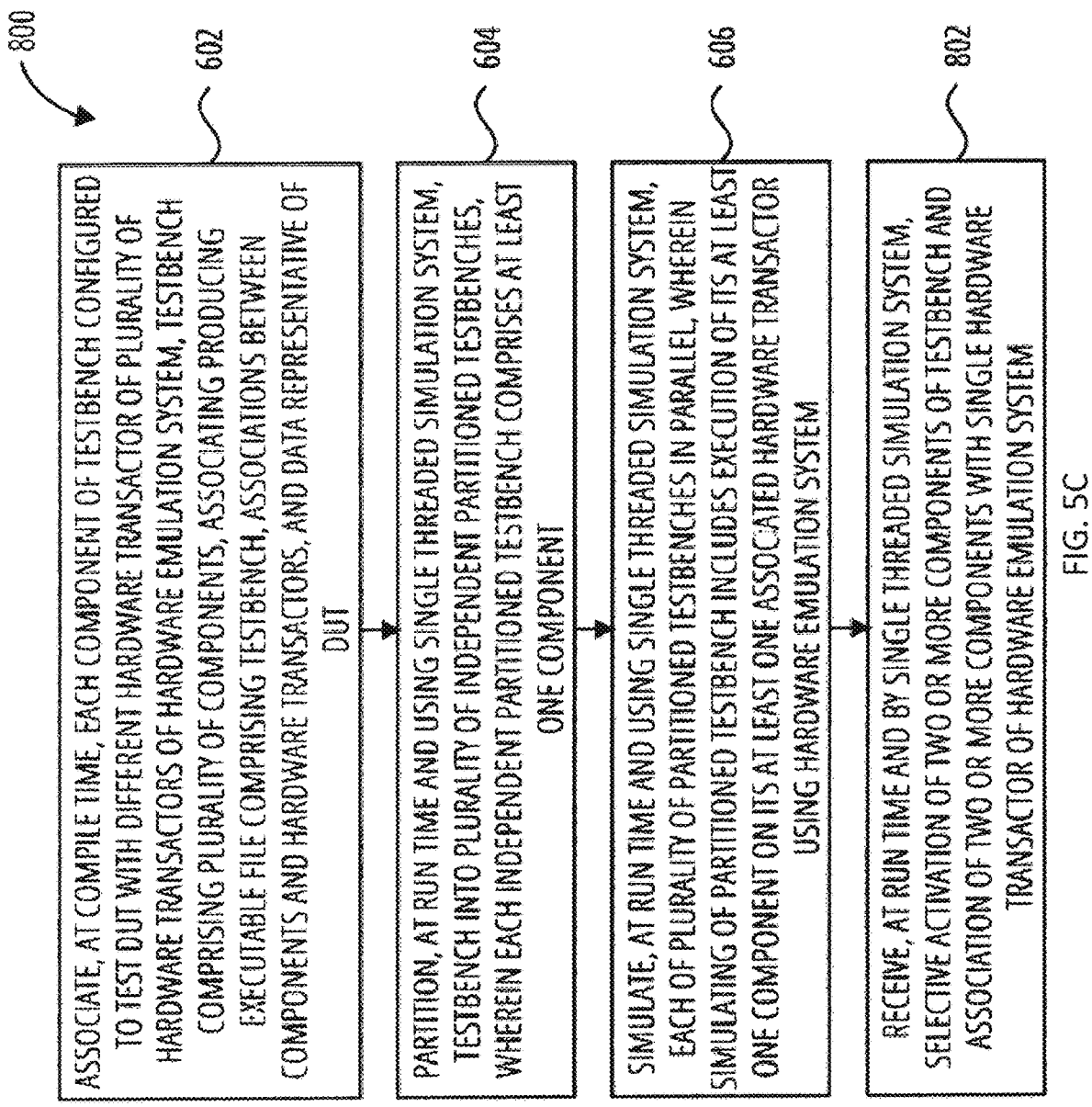

FIG. 5C illustrates a routine for testing an integrated circuit (IC) design under test (DUT) using a hardware emulation system and a single threaded simulation system, in accordance with one embodiment.

FIG. 6 illustrates exemplary testbench partitioning for use with embodiments of the present disclosure.

FIG. 7 illustrates testbench partitioning combination options for use with embodiments of the present disclosure.

Figure 8:
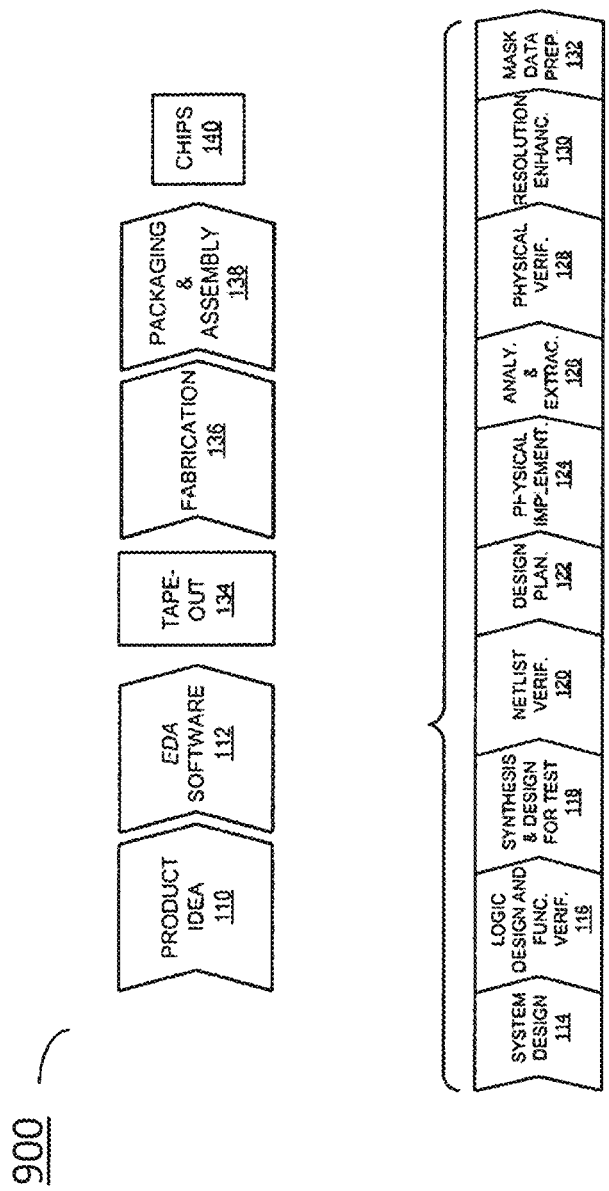

FIG. 8 depicts a flowchart of various operations in the design and fabrication of an integrated circuit in accordance with an embodiment of the present disclosure.

Figure 9A:
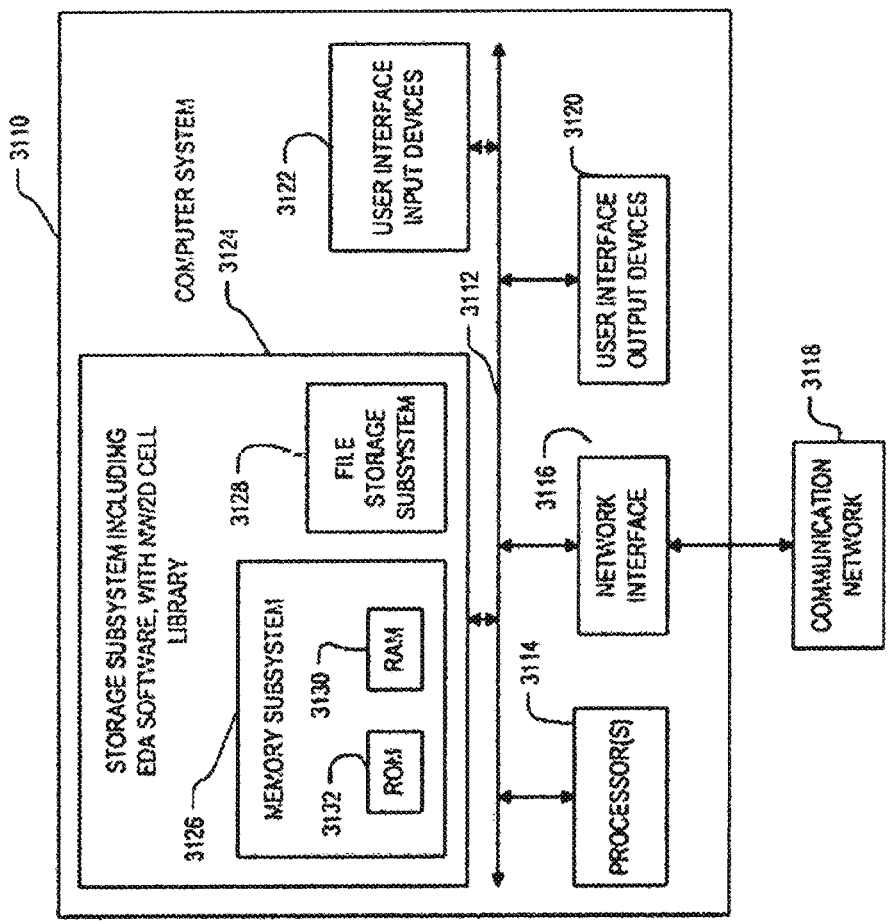

FIGS. 9A, 9B and 9C depict simplified block diagrams of a computer system suitable for use with embodiments of the technology, as well as circuit design and circuit embodiments of the technology.

Figure 10:
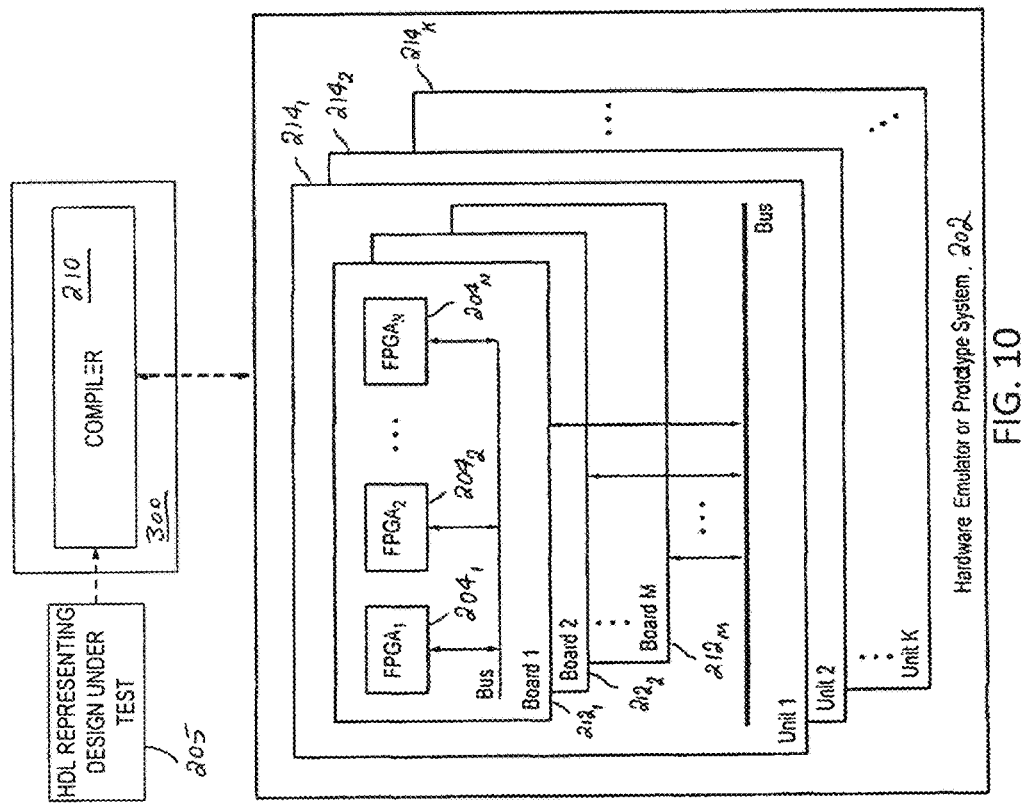

FIG. 10 depicts a block diagram of an emulation system.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Because a behavioral HDL/HVL testbench cannot be accessed through an accelerated hardware platform, it would typically be executed in a single threaded simulator kernel. Thus, for co-simulation with an accelerated platform, only the synthesizable design will run on the accelerated hardware platform, where the execution is faster as well as concurrent. Even for a transaction based acceleration where a part of the testbench runs on the HW, the bottleneck is always on the simulator side.

Whenever there are concurrent requests from hardware platform to simulation platform, the request events get pipelined in the simulator event queue, and they are processed sequentially and slowly by the simulation engine. This effectively brings down the potential gain of the parallel processing acceleration platform.

Single threaded testbench execution brings down the performance benefit of an accelerated platform. Even for a testbench with Bus Functional Models (BFMs) and processes which are inherently concurrent, the execution becomes single threaded. Concurrent process requests initiated by accelerated platform are responded sequentially in the simulation platform.

Simulation acceleration performance is improved by eliminating the bottleneck of sequential execution of the testbench. This is achieved by appropriately partitioning the testbench into multiple parallel processes. In one embodiment, the method of dynamically partitioning testbench into multiple components and attaching those components to the corresponding hardware transactors during runtime.

Embodiments of the present disclosure overcome the aforementioned bottleneck by:

Partitioning the testbench into multiple independent components that can run concurrently. As used herein, concurrent means that components can run in parallel;

Mapping the concurrent components to corresponding concurrent Bus Functional Models executing in the hardware platform; and Making the testbench partitions dynamic using run-time command line arguments so that the testbench components can be selectively activated and attached to the HW interfaces of the design being executed on the hardware platform.

The present embodiments eliminate the bottleneck of sequential processing by the simulator, thus providing higher co-emulation or acceleration performance Additional benefits and impact include:

The improvement in acceleration performance is scalable with the number of potential concurrent testbench processes. Actual results have shown gains in the range of 3-4× over single threaded simulation acceleration performance.

The same testbench can be used for both single threaded and multi-process simulations.

Higher throughput (more data can be sent across the link in the same number of clock cycles) numbers can be achieved which can then enable a transaction based simulation acceleration framework to stress and saturate the DUT for stress test cases.

Though parallel testbenches have been attempted through IPC/shared memory/file based techniques, there does not exist a successful solution for splitting the same HVL TB into different partitions and attaching the different partitions to different HW interfaces.

"Associator" in this context refers to in this context refers to a correlator (see the definition for correlator).

"Circuitry" in this context refers to in this context refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Classifier" in this context refers to in this context refers to a specific type of correlator/associator logic that associates one or more inputs with a category, class, or other group sharing one or more common characteristics. An example of a classifier that may commonly be implemented in programmable hardware is a packet classifier used in network switches, firewalls, and routers (e.g., packet classifiers utilizing Ternary Content Addressable Memories). An example software or firmware classifier is: if (input1.value<12.5) input1.group=group1; else if (input1.value>=12.5 and input1.value<98.1) input1.group=group2; else input1.group=group3; Other examples of classifiers will be readily apparent to those of skill in the art, without undo experimentation.

"Combiner" in this context refers to in this context refers to a logic element that combines two or more inputs into fewer (often a single) output. Example hardware combiners are arithmetic units (adders, multipliers, etc.), time-division multiplexers, and analog or digital modulators (these may also be implemented is software or firmware). Another type of combiner builds an association table or structure (e.g., a data structure instance having members set to the input values) in memory for its inputs. For example: val1, val2, val3→combiner logic→{val1, val2, val3} set.val1=val1; set.val2=val2; set.val3=val3; Other examples of combiners will be evident to those of skill in the art without undo experimentation.

"Comparator" in this context refers to in this context refers to a logic element that compares two or more inputs to produce one or more outputs that reflects similarity or difference of the inputs. An example of a hardware comparator is an operational amplifier that outputs a signal indicating whether one input is greater, less than, or about equal to the other. An example software or firmware comparator is: if (input1==input2) output=val1; else if (input1>input2) output=val2; else output=val3; Many other examples of comparators will be evident to those of skill in the art, without undo experimentation.

"Computer model" in this context refers to in this context refers to the logic (e.g., algorithms and equations) that represent the behavior of the system being modeled. Computer simulation is the actual execution of logic comprising these equations or algorithms Simulation, therefore, is the process of executing a model.

"Correlator" in this context refers to in this context refers to a logic element that identifies a configured association between its inputs. One examples of a correlator is a lookup table (LUT) configured in software or firmware. Correlators may be implemented as relational databases. An example LUT correlator is: |low_alarm_condition|low_threshold_value|0||safe_condition|safe_lower_bound|safe_upper_bound||high_alarm_condition|high_threshold_value|0| Generally, a correlator receives two or more inputs and produces an output indicative of a mutual relationship or connection between the inputs. Examples of correlators that do not use LUTs include any of a broad class of statistical correlators that identify dependence between input variables, often the extent to which two input variables have a linear relationship with each other. One commonly used statistical correlator is one that computes Pearson's product-moment coefficient for two input variables (e.g., two digital or analog input signals). Other well-known correlators compute a distance correlation, Spearman's rank correlation, a randomized dependence correlation, and Kendall's rank correlation. Many other examples of correlators will be evident to those of skill in the art, without undo experimentation.

"Firmware" in this context refers to in this context refers to software logic embodied as processor-executable instructions stored in read-only memories or media.

"FPGA compiler" in this context refers to in this context refers to logic to partition a circuit design across FPGAs in a circuit emulator. FPGA compiler logic divides the user design to be emulated among the FPGAs of the emulator, mapping of the FPGA netlist onto the physical resources within each the FPGA, including placement and routing of signals between the FPGAs. If FPGA compilation fails, it may indicate that the circuit design cannot be emulated by the emulator.

"Global FPGA resource" in this context refers to in this context refers to an FPGA resource that is available to the FPGA compiler to emulate any partition of the circuit. Examples are FPGA registers, lookup tables (LUT), block random-access memory (BRAM), digital signal processor (DSP), and any other basic resource the FPGA provides, as commonly understood in the art.

"Hardware" in this context refers to in this context refers to logic embodied as analog or digital circuitry.

"Incrementer" in this context refers to in this context refers to logic to advance (increase or decrease) a counting or index value by a fixed or predictably variable amount. Examples of hardware incrementers include adder arithmetic circuits and counter circuits. An example of a software incrementer is: x=x+incrementValue. Incrementers may be used as counters, or as logic to advance a referential or associative index in a memory data structure.

"Logic" in this context refers to in this context refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Parser" in this context refers to in this context refers to logic that divides an amalgamated input sequence or structure into multiple individual elements. Example hardware parsers are packet header parsers in network routers and switches. An example software or firmware parser is: aFields=split("val1, val2, val3", ","); Another example of a software or firmware parser is: readFromSensor gpsCoordinate; x_pos=gpsCoordinate.x; y_pos=gpsCoordinate.y; z_pos=gpsCoordinate.z; Other examples of parsers will be readily apparent to those of skill in the art, without undo experimentation.

"Programmable device" in this context refers to in this context refers to an integrated circuit designed to be configured and/or reconfigured after manufacturing. The term "programmable processor" is another name for a programmable device herein. Programmable devices may include programmable processors, such as field programmable gate arrays (FPGAs), configurable hardware logic (CHL), and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks may be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

"Selector" in this context refers to in this context refers to a logic element that selects one of two or more inputs to its output as determined by one or more selection controls. Examples of hardware selectors are multiplexers and demultiplexers. An example software or firmware selector is: if (selection_control==true) output=input1; else output=input2; Many other examples of selectors will be evident to those of skill in the art, without undo experimentation.

"Sequencer" in this context refers to in this context refers to logic to generate an ordered list of outputs from either an unordered or partially ordered set of inputs, or from a starting input and rules to generate next inputs. One attribute of a sequencer is that the outputs are done sequentially, meaning one after the other in time. An example of a hardware sequencer is a multiplexer with a counter driving its selection input. An example of a software or firmware sequencer is: out=val++; Other examples of hardware and software or firmware sequencers will now be readily apparent to those of skill in the relevant arts.

"Software" in this context refers to in this context refers to logic implemented as processor-executable instructions in a machine memory (e.g. read/write volatile or nonvolatile memory or media).

"Switch" in this context refers to in this context refers to logic to select one or more inputs to one or more outputs under control of one or more selection signals. Examples of hardware switches are mechanical electrical switches for switching power to circuits, devices (e.g., lighting), or motors. Other examples of hardware switches are solid-state switches such as transistors. An example of a hardware or firmware switch is: if (selection==true) output=input; else output=0; A somewhat more complicated software/firmware switch is: if (selection)==true and selection2==true) output=input1; else if (selection)==true and selection2==false) output=input2; else if (selection)==false and selection2==true) output=input3; else output=noOp; Switches operate similarly to selectors in many ways (see the definition of Selector), except in some cases switches may select all inputs to the output,(s) not select among inputs. Other examples of switches will be readily apparent to those having skill in the art, without undo experimentation.

"Tangled logic" in this context refers to in this context refers to a highly-connected group of gates that unless specially managed, may create local congestion within an FPGA. Tangled logic is not considered herein as belonging to the global FPGA resource pool. Tangled logic may cause failures during the FPGA compilation or may utilize additional resources to successfully complete the FPGA compilation. Typically only 1% to 10% of a circuit to emulate involves tangled logic, but managing these small portions may account for a disproportionate consumption of resources by the FPGA compiler.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

In experiments involving the present embodiments, a prototype having 4 partitions and 8 transactors (e.g., using a commercially available simulator and emulator such as those available from Synopsys) and minimal communication among the testbenches was used. File based synchronization using the prototype resulted in a runtime, without partitioning, of 97 seconds. When runtime for the prototype included partitions, the runtime was 26 seconds. In another example, another design with 2 partitions and minimal communication resulted in a runtime of 20 minutes without partitions and a runtime of 10 minutes with runtime partitions resulting in ~100× to 200× acceleration.

FIGS. 1A and 1B illustrate prior art emulation/co-simulation environments. In FIG. 1A, an emulation system includes communication between a hardware platform 102, an interface system 104 and a single threaded simulator 106. More specifically, FIG. 1A illustrates how the communication is handled between a single threaded simulator 106 and a hardware platform 102 such as the ZeBu hardware emulation system available commercially from Synopsys, Inc. of Mountain View, Calif. Although not shown in FIG. 1A, interface system 104 includes software instructions that execute on a computer system such as a personal computer or PC. As is well known in the art, the computer system will include a certain amount of PC memory 108 such as 2 GB or 4 GB or some other user determined amount. A portion of the PC memory 108 is used to store the software instructions executing on the computer system and a portion is used to store communications received from either the hardware platform 102 or the single threaded simulator 106.

The single threaded simulator 106, in one embodiment, is a commercially available simulator, VCS, that is commercially available from Synopsys, Inc. of Mountain View, Calif.

As illustrated in FIG. 1A, hardware platform 102 is coupled to interface system 104 to enable communication therebetween. Similarly, interface system 104 is coupled to the single threaded simulator 106 to enable the communication therebetween. The computer system executes the executing software to manage and coordinate the separate operation the hardware platform 102 and the single threaded simulator 106.

In operation, when PC memory is not full, hardware platform 102 may send without any slow-down or decrease in the rate in which it communicates with interface system 104. When PC memory is full, hardware platform 102 waits for free space to send messages. Messages are read sequentially at speed of single threaded simulator 106.

In FIG. 1B, a testbench executing in a sequential processing environment single handedly reduces the overall performance benefit of a parallel processing environment provided by the accelerated platform.

FIG. 1C illustrates an exemplary simulation environment 150 for use with embodiments of the present disclosure. In FIG. 1C, partitioning of the testbench into multiple independent testbenches on the simulator side (e.g., a single threaded simulator) enables parallel processing of the multiple testbenches at the with multiple-simulator processes. This partitioning complements the parallel processing environment provided by the hardware accelerated platform by attaching independent testbenches (i.e., partitions) to targeted transactors.

FIG. 2 illustrates a prior art simulation environment. In FIG. 2, a sequence diagram 200 for a hardware/software co-simulation system illustrates a typical communication bottleneck occurring during transaction based simulation acceleration. In FIG. 2, a simulation platform 202 is coupled to an acceleration platform 204 by way of an interface 206.

In the co-simulation system of FIG. 2, a bus functional model (BFM) is implemented in software. By way of example, the BFM may be a processor core such as an ARC processor core. ARC is a trademark of Synopsys, Inc. of Mountain View, Calif. By way of further example, a device under test (DUT) is implemented on the acceleration platform 204. The DUT may include circuitry that, when manufactured as an integrated circuit, will reside on a single piece of silicon as the processor or on a separate piece of silicon but operatively in communication with the processor.

By way of further example, transactional communication during transaction based acceleration is contemplated. A behavioral testbench having software BFMs (VIP-0, VIP-1) interacts with certain hardware transactors xtor0 and xtor1 associated with the hardware platform 102. In this example, when the transactors simultaneously invoke 'import' calls to the testbench through the interface 206, the testbench executing in the simulation platform 202 will process the import calls one by one in a sequential manner (taking time t-0 for processing the import call from xtor0 and t-1 for the call from xtor1). As shown in the sequence diagram 200 of FIG. 2, effective processing time for the import call sent by the transactor xtor1 is high (t0+t1). This is true even if the software BFMs are totally independent of each other.

As discussed herein, simulation acceleration performance can be improved if the bottleneck of sequential execution of the testbench is removed. This can be achieved by appropriately partitioning the testbench into multiple parallel processes, as presented in the solutions of the present embodiments.

FIG. 3 illustrates an exemplary simulation environment for use with embodiments of the present disclosure. In FIG. 3, exemplary sequence diagram 400 illustrates the execution of testbench components VIP-0 and VIP-2 (which are responsible for the processing of the import calls of transactors xtor0 and xtor1 respectively) made into parallel processes and attached or mapped to the corresponding transactors. With this parallel process-transactor relationship, the processing of import calls (e.g., by the simulation platform 402, passed through interface 404) from the hardware or acceleration platform 406 occur in parallel, resulting in an improved performance. In this example, the effective processing time for xtor1 gets reduced to t1 instead of t0+t1.

FIG. 4A illustrates an exemplary runtime partitioning of a testbench for use with embodiments of the present disclosure. In the embodiment of FIG. 4A, the partitioning of the testbench components or a partitioned testbench 500 is accomplished by invoking $value$plusargs at runtime. Depending on the command line argument, the appropriate concurrent testbench components are activated. The partitioned testbench 500 is compiled once into an executable and the executable subsequently able to be run multiple times with partitions simulating in parallel in various combinations through the use of runtime commands (i.e., at the command line). The runtime commands instruct the simulator which processes or components are to be activated and the associated hardware transactor list to be attached to the processes or components. An end user having a client device (i.e., access to command line or runtime instructions) has the flexibility to mix and match partitions and hardware transactor combinations.

FIG. 4B illustrates an exemplary runtime partitioning of a testbench for use with embodiments of the present disclosure. FIG. 4B shows another partitioned testbench 510 that, at the instruction of a user/runtime argument, is the same testbench as shown in 500 but run as a single process as well without any recompile. This ability to group components provides the maximum benefit of hardware and software flexibility. As shown in the example below, appropriate partitioned testbench 510 BFMs are activated based on the value $value$plusargs and the interface system implementation allows command line options to also bind in the relevant hardware platform interface to which the partitioned testbench 510 should communicate. Hence, multiple simulator licenses can be used to bump up over acceleration and everything can be managed through command-line and regression infrastructure. The entire partitioned testbench 510 can be run as a single process in some embodiments and multiple processes with higher acceleration performance in other embodiments.

In embodiments, multiple invocations of the executable file can be forked out with different runtime arguments to execute multiple times concurrently For example:

$>simv+processname=VIP0+VIP1+zebu+xtor_list0_1
&

$>simv+processname=VIP2+zebu+xtor_list2.

FIG. 5A illustrates a routine for testing an integrated circuit (IC) design under test (DUT) using a hardware emulation system and a single threaded simulation system, in accordance with one embodiment. In block 602, routine 600 associates, at compile time, each component of a testbench configured to test the DUT with a different hardware transactor of a plurality of hardware transactors of the hardware emulation system, the testbench comprising a plurality of components, the associating producing an executable file comprising the testbench, the associations between components and hardware transactors. In block 604, routine 600 partitions, at run time and using the single threaded simulation system, the testbench into a plurality of independent partitioned testbenches, wherein each independent partitioned testbench comprises at least one component. In block 606, routine 600 simulates, at run time and using the single threaded simulation system, each of the plurality of partitioned testbenches in parallel, wherein the simulating of a partitioned testbench includes execution of its at least one component on its at least one associated hardware transactor using the hardware emulation system.

FIG. 5B illustrates a routine for testing an integrated circuit (IC) design under test (DUT) using a hardware emulation system and a single threaded simulation system, in accordance with one embodiment. In block 602, routine 700 associates, at compile time, each component of a testbench configured to test the DUT with a different hardware transactor of a plurality of hardware transactors of the hardware emulation system, the testbench comprising a plurality of components, the associating producing an executable file comprising the testbench, the associations between components and hardware transactors, and data representative of the DUT. In block 604, routine 700 partitions, at run time and using the single threaded simulation system, the testbench into a plurality of independent partitioned testbenches, wherein each independent partitioned testbench comprises at least one component. In block 606, routine 700 simulates, at run time and using the single threaded simulation system, each of the plurality of partitioned testbenches in parallel, wherein the simulating of a partitioned testbench includes execution of its at least one component on its at least one associated hardware transactor using the hardware emulation system. In block 702, routine 700 receives, at run time and by the single threaded simulation system, selective activation of a component of the testbench and association of the component with a particular hardware transactor of the hardware emulation system.

FIG. 5C illustrates a routine for testing an integrated circuit (IC) design under test (DUT) using a hardware emulation system and a single threaded simulation system, in accordance with one embodiment. In block 602, routine 800 associates, at compile time, each component of a testbench configured to test the DUT with a different hardware transactor of a plurality of hardware transactors of the hardware emulation system, the testbench comprising a plurality of components, the associating producing an executable file comprising the testbench, the associations between components and hardware transactors, and data representative of the DUT. In block 604, routine 800 partitions, at run time and using the single threaded simulation system, the testbench into a plurality of independent partitioned testbenches, wherein each independent partitioned testbench comprises at least one component. In block 606, routine 800 simulates, at run time and using the single threaded simulation system, each of the plurality of partitioned testbenches in parallel, wherein the simulating of a partitioned testbench includes execution of its at least one component on its at least one associated hardware transactor using the hardware emulation system. In block 802, routine 800 receives, at run time and by the single threaded simulation system, selective activation of the two or more components of the testbench and association of the two or more components with the single hardware transactor of the hardware emulation system.

FIG. 6 illustrates exemplary testbench partitioning for use with embodiments of the present disclosure. In FIG. 6, a testbench comprises multiple components (e.g., vip0, vip1, vip2). During initialization, and using in this example $value$plusargs, each component vip0, vip1, and vip2 is partitioned such that it can be mapped or associated with one or more different hardware transactors.

FIG. 7 illustrates testbench partitioning combination options for use with embodiments of the present disclosure. In FIG. 7, compilation of the testbench occurs only one time. Subsequently, different partitions can be selectively chosen for different forked runs of the co-simulation process (see, e.g., "no partition," "3 partitions," "2 partitions," of FIG. 7). When there are multiple partitions of a testbench, then the synchronization and information sharing among the testbench components occurs through a simple file based or any other appropriate inter-process communication (e.g., shared memory, client-server, and the like), or even the hardware channel itself as a medium to communicate.

If the testbench uses standard methodologies like UVM/VMM, its features like options, agents and ports can be used to efficiently and easily handle the partitions.

A testbench for a single threaded simulator 106 execution brings down the performance benefit of an acceleration platform 204. Therefore, the presently disclosed embodiments provide concurrent process requests that may be initiated by the acceleration platform 406 to be responded to in the simulation platform 402 concurrently (i.e., in parallel) to reduce communication bottlenecks.

In particular, with a partitioned testbench 500/510, multiple independent components can run in parallel. The multiple independent components can seamlessly attach to corresponding transactors of the accelerated or acceleration platform.

The present embodiments illustrate a dynamically partitioned testbench 500 through the use of $value$plusargs such that testbench components can be selectively activated and attached to the hardware platform. In preferred embodiments, a interface system connects the DUT running on the accelerated platform during runtime through command line control and handles information exchange among the partitioned components (if any) through file based or through inter-process communication.

DETAILED DESCRIPTION—TECHNOLOGY SUPPORT

GENERAL COMPUTER EXPLANATION

FIGS. 9A, 9B and 9C are simplified block diagrams of a computer system suitable for use with embodiments of the technology, as well as circuit design and circuit embodiments of the technology.

In FIG. 9A, computer system 3110 typically includes at least one computer or processor 3114 which communicates with a number of peripheral devices via bus subsystem 3112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 3110 depicted in FIG. 10A is intended only as one example for purposes of illustrating the preferred embodiments. Many other configurations of computer system 3110 are possible having more or less components than the computer system depicted in FIG. 9A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 3122 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 3110 or onto communication network 3118. User interface input devices typically allow a user to select objects, icons, text and the like that appear on some types of user interface output devices, for example, a display subsystem.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 (or other volatile storage device) for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 3128.

Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses. For example, RAM-based main memory can communicate directly with file storage systems using Direct Memory Access (DMA) systems.

FIG. 9B depicts a memory 3140 such as a non-transitory, computer readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 9C signifies an integrated circuit 3190 created with the described technology that includes one or more cells selected, for example, from a cell library.

DETAILED DESCRIPTION—TECHNOLOGY SUPPORT

HARDWARE/SOFTWARE EQUIVALENCE

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

DETAILED DESCRIPTION—TECHNOLOGY SUPPORT

EDA SYSTEM/WORKFLOW EXPLANATION

FIG. 8 illustrates various processes 900 performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 110 with information supplied by a designer, information which is transformed during a process to create an item of manufacture (referred to herein as a design or device) that uses an EDA software tool 112, which may also be signified herein as EDA software, as a design tool, or a verification tool. When the design is finalized, it can be taped-out 134, which typically is when artwork (e.g., geometric patterns) for the integrated circuit is sent to a fabrication facility to manufacture the mask set, which is then used to manufacture the integrated circuit. After tape-out, a semiconductor die is fabricated 136 and packaging and assembly processes 138 are performed, which result in the finished integrated circuit 140 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 112 includes processes 114-132, which are described below. This design flow description is for illustration purposes only and is not meant to limit the present disclosure. For example, an actual integrated circuit design may require a designer to perform the design operations in a different sequence than the sequence described herein.

During system design 114, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 116, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (RTM="Registered Trademark").

During synthesis and design for test 118, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 120, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 124, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 126, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 128, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 130, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 132, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 112.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—TECHNOLOGY SUPPORT

EMULATION ENVIRONMENT EXPLANATION

An EDA software system, such as element 112 depicted in FIG. 8, typically includes an emulation system 116 to verify the functionality of the circuit design. FIG. 10 depicts a typical emulation system 1100 which includes a host computer system 300 (often part of an EDA system) and an emulator system 202 (typically a set of programmable devices such as Field Programmable Gate Arrays (FPGAs)). The host system generates data and information, typically using a compiler 210, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 300 comprises one or more processors. In the embodiment where the host system is comprised of multiple processors, the functions described herein as being performed by the host system may be distributed among the multiple processors.

The host system 300 typically includes a compiler 210 that processes code written in a hardware description language that represents a DUT, producing data (typically binary) and information that is used to configure the emulation system 202 to emulate the DUT. The compiler 210 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $204_1$ to $204_N$ in FIG. 10. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $204_1$-$204_N$ may be placed into one or more hardware boards $212_1$ through $212_M$. Many of such boards may be placed into a hardware unit, e.g. $214_1$. The boards within a unit may be connected using the backplane of the unit or any other types of connections. In addition, multiple hardware units (e.g., $214_1$ through $214_K$) may be connected to each other by cables or any other means to form a multi-unit system. In general, the hardware emulation or prototype system 202 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 110 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 210 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/reemulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

DETAILED DESCRIPTION—SEMANTIC SUPPORT

The signifier 'commercial solution' signifies, solely for the following paragraph, an engineering domain-specific (and thus non preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

We claim:

1. A computer implemented method for testing an integrated circuit (IC) design under test (DUT) using a hardware emulation system and a simulation system configured to sequentially process requests from the hardware emulation system, comprising:
  associating, at compile time, each component of a testbench configured to test the DUT with a different hardware transactor of a plurality of hardware transactors of the hardware emulation system, the testbench comprising a plurality of components, the associating producing an executable file comprising the testbench, associations between components of the testbench and hardware transactors, and data representative of the DUT;
  partitioning, at run time and using the simulation system, the testbench into a plurality of independent partitioned testbenches, wherein each independent partitioned testbench comprises at least one component of the plurality of components; and
  simulating, at run time and using the simulation system, each independent partitioned testbench of the plurality of independent partitioned testbenches in parallel, wherein the simulating of an independent partitioned testbench comprises execution of its at least one component using its at least one associated hardware transactor of the hardware emulation system.

2. The computer implemented method of claim 1, wherein an association of one or more components of the testbench with one or more different hardware transactors of the hardware emulation system is dynamically changed at run time and without recompiling the testbench.

3. The computer implemented method of claim 1, wherein original associations of two or more components of the testbench with different hardware transactors of the hardware emulation system are dynamically changed at run time and without recompiling the testbench such that the two or more components of the testbench are associated with a single hardware transactor of the hardware emulation system.

4. The computer implemented method of claim 2, further comprising:
  receiving, at run time and by the simulation system, selective activation of a component of the testbench and association of the component with a particular hardware transactor of the hardware emulation system.

5. The computer implemented method of claim 3, further comprising:
  receiving, at run time and by the simulation system, selective activation of the two or more components of the testbench and association of the two or more components with the single hardware transactor of the hardware emulation system.

6. The computer implemented method of claim 1, wherein the components of the testbench exchange data through one of file based or inter-process communication.

7. The computer implemented method of claim 1, wherein a hardware transactor comprises a bus functional module (BFM).

8. The computer implemented method of claim 3, wherein the selective activation is received via a command line interface.

9. The computer implemented method of claim 8, wherein the selective activation comprises $value$plusargs.

10. The computer implemented method of claim 1, wherein the hardware emulation system comprises an FPGA.

11. A system for testing an integrated circuit (IC) design under test (DUT), the system comprising a first module configured as a hardware emulation system and a second module configured as a simulation system configured to sequentially process requests from the hardware emulation system, the second module comprising a processor and a memory storing instructions that, when executed by the processor, configure the simulation system to:
  associate, at compile time, each component of a testbench configured to test the DUT with a different hardware transactor of a plurality of hardware transactors of the hardware emulation system, the testbench comprising a plurality of components, the associating producing an executable file comprising the testbench, associations between components and hardware transactors, and data representative of the DUT;
  partition, at run time, the testbench into a plurality of independent partitioned testbenches, wherein each independent partitioned testbench comprises at least one component; and
  simulate, at run time, each independent partitioned testbench of the plurality of independent partitioned testbenches in parallel, wherein the simulating of an independent partitioned testbench comprises execution of its at least one component using its at least one associated hardware transactor of the hardware emulation system.

12. The system of claim 11, wherein an association of one or more components of the testbench with one or more different hardware transactors of the hardware emulation system is dynamically changed at run time and without recompiling the testbench.

13. The system of claim 11, wherein original associations of two or more components of the testbench with different hardware transactors of the hardware emulation system are dynamically changed at run time and without recompiling the testbench such that the two or more components of the testbench are associated with a single hardware transactor of the hardware emulation system.

14. The system of claim 12, wherein the instructions further configure the simulation system to:
  receive, at run time and by the simulation system, selective activation of a component of the testbench and association of the component with a particular hardware transactor of the hardware emulation system.

15. The system of claim 13, wherein the instructions further configure the simulation system to:
  receive, at run time and by the simulation system, selective activation of the two or more components of the testbench and association of the two or more components with the single hardware transactor of the hardware emulation system.

16. The system of claim 11, wherein the components of the testbench exchange data through one of file based or inter-process communication.

17. The system of claim 11, wherein a hardware transactor is a bus functional module (BFM).

18. The system of claim 12, wherein the selective activation is received via a command line interface.

19. The system of claim 18, wherein the selective activation comprises $value$plusargs.

20. The system of claim 11, wherein the hardware emulation system comprises an FPGA.

21. The system of claim 11, wherein the hardware emulation system comprises an acceleration platform.

22. A more efficient electronic structure for circuit design, testing and/or manufacturing comprising: a first non-abstract module configured as a hardware emulation system and a second non-abstract module configured as a simulation system configured to sequentially process requests from the hardware emulation system, the first non-abstract module and the second non-abstract module applied usefully in commerce by enabling the electronic structure in an article of manufacture for transforming information, where the first non-abstract module and second non-abstract module are either mostly configured by a manufacturer, configured, at least in part, by a user, or configured by both the manufacturer and the user; and equivalent articles of manufacture enabling the electronic structure to:
- associate, at compile time, each component of a testbench configured to test a DUT with a different hardware transactor of a plurality of hardware transactors of the hardware emulation system, the testbench comprising a plurality of components, the associating producing an executable file comprising the testbench, the associations between components and hardware transactors, and data representative of the DUT;
- partition, at run time, the testbench into a plurality of partitioned testbenches each comprising at least one component; and
- simulate, at run time, each of the plurality of partitioned testbenches in parallel, wherein the simulating of a partitioned testbench comprises execution of its at least one component using its at least one associated hardware transactor of the hardware emulation system.

* * * * *